(12) United States Patent
Miyahara et al.

(10) Patent No.: US 8,618,743 B2
(45) Date of Patent: Dec. 31, 2013

(54) HIGH STABILITY DIMMER

(75) Inventors: Takakazu Miyahara, Kagoshima (JP);
Hiroshi Kirihara, Kagoshima (JP);
Mitsuhiro Hashiguchi, Hioki (JP)

(73) Assignee: ELM Inc., Kagoshima (JP)

( * ) Notice: Subject to any disclaimer, the term of this patent is extended or adjusted under 35 U.S.C. 154(b) by 0 days.

(21) Appl. No.: 13/699,907

(22) PCT Filed: Nov. 16, 2011

(86) PCT No.: PCT/JP2011/076388
§ 371 (c)(1),
(2), (4) Date: Feb. 11, 2013

(87) PCT Pub. No.: WO2012/081350
PCT Pub. Date: Jun. 21, 2012

(65) Prior Publication Data
US 2013/0300301 A1  Nov. 14, 2013

(30) Foreign Application Priority Data

Dec. 14, 2010  (JP) ................................. 2010-278289

(51) Int. Cl.
*G05F 1/00* (2006.01)
(52) U.S. Cl.
USPC ........ 315/291; 315/247; 315/307; 315/185 S; 315/312
(58) Field of Classification Search
USPC ..................... 315/247, 224, 225, 185 S, 291, 315/307–326, DIG. 4, DIG. 7, DIG. 5
See application file for complete search history.

(56) References Cited

U.S. PATENT DOCUMENTS 6,407,515 B1 * 6/2002 Hesler et al. .................. 315/294

FOREIGN PATENT DOCUMENTS

| JP | 58-148663 | 9/1983 |
| JP | 59-60886 | 6/1984 |
| JP | 59-60891 | 6/1984 |
| JP | 59-60999 | 7/1984 |
| JP | 3-2342 | 10/1991 |
| JP | 11-032485 | 2/1999 |

* cited by examiner

*Primary Examiner* — Tuyet Thi Vo
(74) *Attorney, Agent, or Firm* — Frommer Lawrence & Haug LLP; William S. Frommer

(57) ABSTRACT

The present invention is aimed at providing a dimmer capable of preventing malfunctions due to noise contamination or waveform distortion of the voltage of an AC power source. The dimmer according to the present invention has a time division control circuit for controlling an effective voltage supplied to a lighting load by regulating the period of time to turn on a switching element, and further includes: a zero-crossing detector section 11 for detecting a zero-crossing point and generating a zero-crossing signal whose value changes at the zero-crossing point; an oscillator 13 for generating an oscillating signal having a frequency equal to that of the AC power source or an integral multiple of this frequency; a reference point determiner section 14 for measuring a phase difference between the zero-crossing signal and the oscillating signal every time the zero-crossing signal is generated, and for determining a reference point for setting the timing of turning on or off the switching element 6 based on a data of the measured value of the phase difference; and a time division control signal generator (on/off timing calculator section 15 and time division control signal generator section 17) for sending an on/off signal to the switching element 6 at the timing determined on the basis of the reference point and the effective voltage to be supplied to the lighting load.

15 Claims, 11 Drawing Sheets

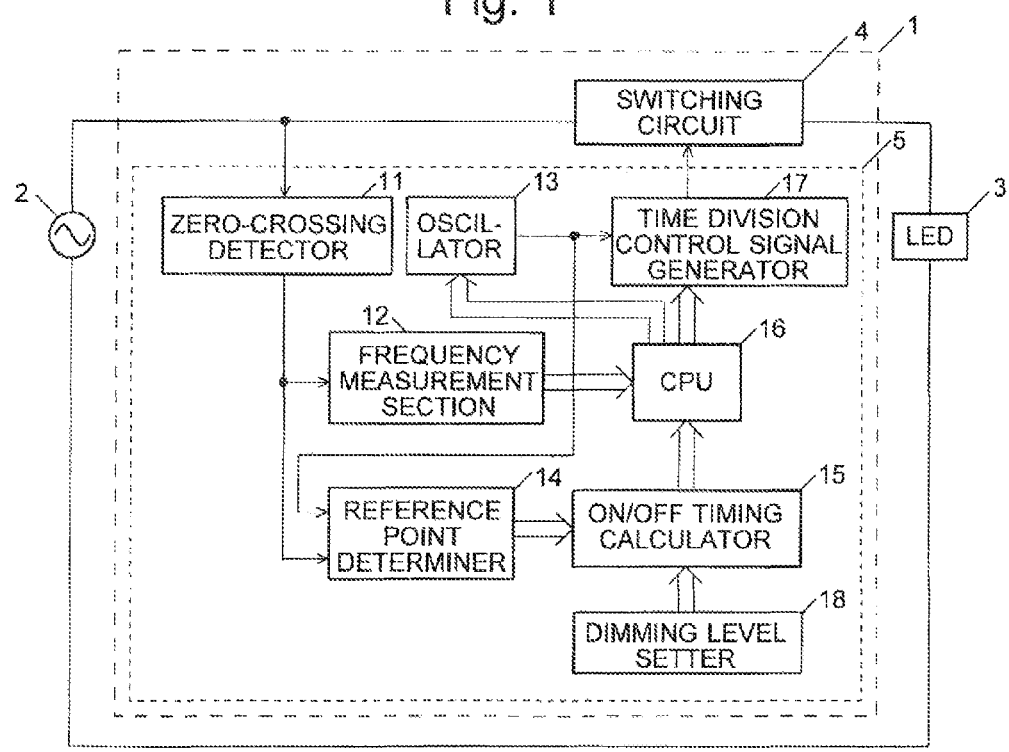

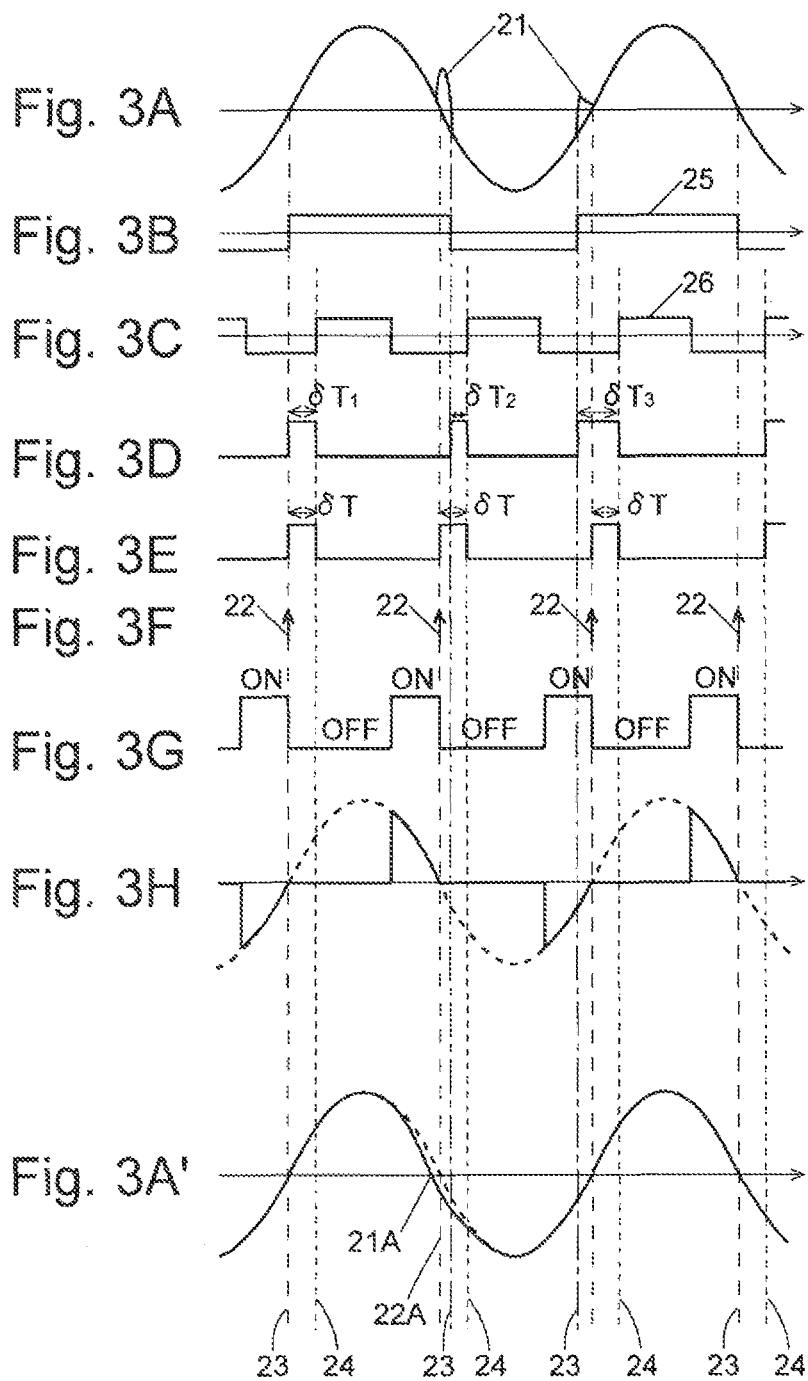

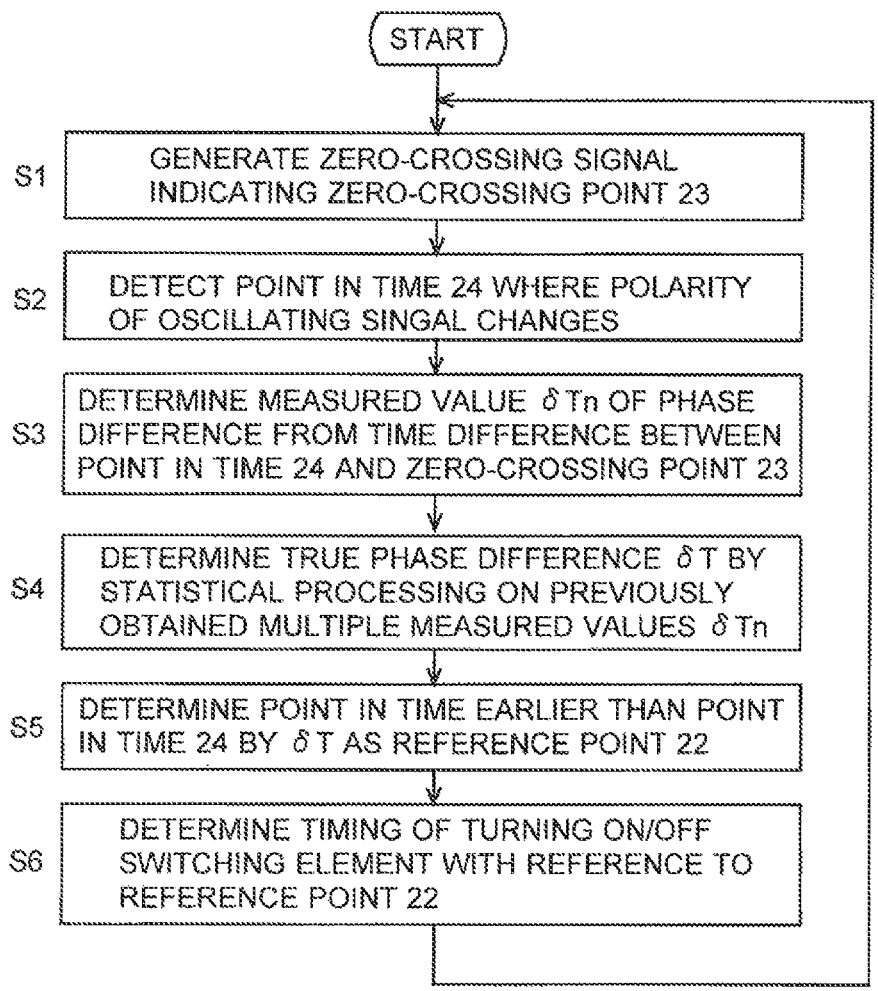

HIGH STABILITY DIMMER

TECHNICAL FIELD

The present invention relates to a dimmer for controlling the intensity of light generated by a light source, such as a light emitting diode (LED).

BACKGROUND ART

As a means for controlling the output of a light source by using an alternating current (AC) power source, a phase control system including a semiconductor switching element has been commonly used. Generally, in the phase control system, the switching element is serially connected between the AC power source and the light source (lighting load). The dimming of the light source is performed by controlling the conduction angle within one cycle of the AC voltage, i.e. the range of angles in which the switching element is turned on, so as to vary the effective voltage supplied from the AC power source to the lighting load.

In one type of conventional dimmer using the phase control system, a zero-crossing point (the point in time at which the AC voltage becomes zero) is used as the reference point for controlling the conduction angle. This type of dimmer includes a zero-crossing detector for detecting the zero-crossing point.

However, the zero-crossing detector may possibly malfunction due to noise contamination or waveform distortion of the AC voltage supplied from the power source; in the case of a dimmer circuit with multiple dimmers connected thereto, the switching noise generated by one dimmer can contaminate the AC voltage supplied to another dimmer circuit, causing the zero-crossing detector to malfunction. In particular, if the AC voltage is supplied from a power generation by natural energy, such as wind power generation or solar power generation, the power is unstable and it is difficult to completely eliminate the noise or waveform distortion even if the power is controlled by the "smart grid", i.e. a power grid system having the function of autonomously controlling the electric power supply and demand by means of telecommunication devices and computers. Using an in-house power generation is also more likely to cause the noise contamination or waveform distortion than using the commercial power supply. If such a noise or waveform distortion occurs, the zero-crossing detector will mistake a point at which the AC voltage is not actually zero for the zero-crossing point, or fail to detect a point at which the AC voltage is actually zero as the zero-crossing point. As a result, a brightness fluctuation or flicker of the lighting apparatus or the like occurs. Such problems are particularly noticeable in the case of an apparatus using an LED as the light source.

One method for more accurately detecting the zero-crossing point uses a phase lock loop (PLL) circuit (for example, see Patent Document 1). In this system, the zero-crossing detector generates a pulse signal every time it detects the zero-crossing point. The PLL circuit, winch includes an oscillator for generating an oscillating signal, receives the pulse signal and outputs an oscillating signal while performing a feedback control to synchronize the oscillating signal with the pulsed signal (i.e. to make these signals in phase with each other). Pulse signals originating from noise or other factors are out of phase with the oscillating signal and hence can be removed. However, the PLL circuit has the problem that, if the response speed is set at a low level, a considerable length of time will be needed to establish or restore the synchronization when the lighting apparatus is energized or the synchronization is broken for some reasons, during which time the amount of light of the apparatus will fluctuate. On the other hand, setting a higher response speed to avoid this problem will lead to an insufficient removal of the noise.

Patent Document 2 discloses a dimmer in which a fast Fourier transform of an AC signal before being sent to the zero-crossing detector is performed to extract only the fundamental component of the AC signal, and this signal, which is free from noise, is sent to the zero-crossing detector so that the zero-crossing point can be detected on the basis of the noise-free signal. However, this dimmer is expensive since it requires a high-performance computing unit to handle a large number of sampled data of the signal of the AC voltage during the fast Fourier transform operation.

BACKGROUND ART DOCUMENT

Patent Document

Patent Document 1: JP-A S58-148663
Patent Document 2: JP-A H11-032485

SUMMARY OF THE INVENTION

Problem to be Solved by the Invention

The problem to be solved by the present invention is to provide a dimmer capable of preventing malfunctions due to the noise contamination of waveform distortion of a voltage supplied from an AC power source.

Means for Solving the Problems

A dimmer according to the present invention aimed at solving the aforementioned problem is a dimmer including: a switching circuit having a switching element and being serially connected to an alternating-current (AC) power source and a lighting load; and a time division control circuit for controlling an effective voltage supplied to the lighting load by regulating the period of time to turn on the switching element, and the dimmer further including:

a) a zero-crossing detector for detecting a zero-crossing point at which the voltage of the AC power source becomes zero and for generating a zero-crossing signal whose value changes at the zero-crossing point;

b) an oscillator for generating an oscillating signal having a frequency equal to the frequency of the AC power source or an integral multiple of the frequency of the AC power source;

c) a reference point determiner for measuring a phase difference between the zero-crossing signal and the oscillating signal every time the zero-crossing signal is generated, and for determining a reference point for setting a timing of turning on or off the switching element based on a data of measured values of the phase difference; and d) a time division control signal generator for sending to the switching element an on/off signal for turning on or off the switching element, at the timing determined on the basis of the reference point and the effective voltage to be supplied to the lighting load.

In the dimmer according to the present invention, as explained earlier, the zero-crossing signal generated by the zero-crossing detector contains a signal that does not indicate the correct zero-crossing point due to noise or waveform distortion. On the other hand, the oscillating signal generated by the oscillator has a frequency equal to the frequency of the AC power source or an integral multiple of the frequency of the AC power source. This oscillating signal is always generated at a point in time that corresponds to the correct (or proper) zero-crossing point of the AC power source, although its point of generation (i.e. phase) is different from the zero-crossing point of the frequency of the power source. The reference point determiner measures this phase difference and determines a reference point based on the data of the phase difference every time the zero-crossing signal is generated. The reference point is a point that corresponds to the correct zero-crossing point of the AC power source. As will be described later, various kinds of statistical methods are available for the determination of this reference point.

By determining the reference point in this manner, the dimmer according to the present invention prevents the reference point from being incorrect due to the noise contamination or waveform distortion of the AC power source. Using this reference point, the time division control signal generator can correctly determine the timing of turning on or off the switching element. Turning the switching element on and off with a correct timing in this manner prevents the brightness fluctuation or flicker of the lighting apparatus.

In the dimmer according to the present invention, the use of the phase difference between the zero-crossing signal and the oscillating signal allows the oscillator to generate the oscillating signal with a phase unrelated to that of the zero-crossing signal. Unlike the device using a PLL circuit, it is unnecessary to control the oscillating signal so as to make it in phase with the zero-crossing signal. Therefore, the dimmer according to the present invention can be higher in response speed than the device using a PLL circuit.

The data to be used in the signal processing, i.e. the phase difference between the zero-crossing signal and the oscillating signal, is obtained for every half cycle of the AC voltage. Such a small amount of data can be handled using an inexpensive computing unit since it is unnecessary to handle a large number of sampled data as in the conventional system which performs a fast Fourier transform of the AC voltage signal.

The frequency of the oscillating signal may be a value that is predetermined according to the frequency of the AC power source. Alternatively, it is also possible to provide a frequency setter for measuring the frequency of the AC power source or the frequency of the zero-crossing signal and for setting the frequency of the oscillating signal of the oscillator based on the measured frequency. This design makes the dimmer independent of the difference in the frequency of the AC power sources used in different countries, regions and so on.

One example of the statistical method for determining the reference point in the reference point determiner is hereinafter described. In the reference point determiner of this example, every time a zero-crossing point determined from the zero-crossing signal (this zero-crossing detection does not always coincide with the true zero-crossing point in the AC power source due to the noise contamination or other factors) is detected, an average of the phase differences of a plurality of zero-crossing points over a predetermined period of time is calculated, and a point in time earlier (if the phase of the oscillating signal is advanced from that of the zero-crossing point) or later (if the phase of the oscillating signal is delayed from that of the zero-crossing point) than the point in time as the reference of the phase of the osculating signal (e.g. the point in time when oscillating signal changes from positive to negative or vice versa) by the average of the phase difference is chosen as the reference point. Under ideal conditions, i.e. when there is no influence from noise or the like, this reference point coincides with the zero-crossing point. Even if a wrong zero-crossing point (displaced from the true reference point) is included within the aforementioned predetermined period of time, an approximately correct phase difference, and hence an appropriately correct reference point, can be obtained by averaging the phase differences. In the average calculation, the largest and smallest values of the phase differences at the aforementioned plurality of zero-crossing points may be excluded, leaving the other values to be used to calculate the average. Weighting the phase differences according to a predetermined condition so as to vary the degree of contribution of each zero-crossing point is also possible.

Alternatively, the reference point may be determined by the fast Fourier transform of a differential signal indicating the difference between the zero-crossing signal and the oscillating signal. This fast Fourier transform uses only one differential signal for every half cycle of the AC voltage. Therefore, it is unnecessary to handle a large number of sampled data as in the system performing the fast Fourier transform in the conventional manner.

In the dimmer according to the present invention, the reference point may be directly used as the timing of turning on and off the switching element. Alternatively, a point in time displaced from the reference point by a predetermined length of time may be used as the timing of turning on and off. In a particularly preferable mode of the present invention, a point in time that is a predetermined length of time earlier than a point in time that is out of phase with the reference point by $\pi/2$ (i.e. a point in time where the voltage of the AC power source peaks) is chosen as the timing of turning on, while a point in time that is the same length of time later than the point in time that is out of phase with the zero-crossing point by $\pi/2$ is chosen as the timing of turning off. Such a timing control reduces the phase difference between the AC voltage and the alternating current and prevents the decrease in the power factor during the dimming operation.

The reference point determiner and the time division control signal generator can be realized by using a software program and a central processing unit (CPU). In the case of using the frequency setter, the functions of measuring the frequency and setting the frequency of the oscillating signal may also be realized by using a software program and a CPU. The oscillator can be realized by using the external clock function of the CPU.

In a preferable mode of the present invention, the dimmer further includes:

a dimming level setter for performing an operation for setting an effective voltage to be supplied to the lighting load, so as to set a dimming level of the lighting load, wherein the dimming level setter is constructed in such a manner that:

a minimum effective voltage at which the lighting load begins to emit light is set as a light-activating effective voltage, the light-activating effective voltage is related to a predetermined light-activating position within the range of the aforementioned operation in the dimming level setter, and values of the effective voltage between the light-activating effective voltage and a highest level of the effective voltage supplied to the lighting load within the aforementioned range are assigned between the light-activating position and a position corresponding to the highest level of the effective voltage.

By this system, the range of the effective voltage where the lighting load does not become activated (including the range of the effective voltage where the activated light is too faint to be recognized by users) will not be broadly assigned within the operating range of the dimming level setter. Accordingly, users can operate the dimming level setter with a natural feeling.

Effect of the Invention

By the present invention, malfunctions of the dimmer due to the noise contamination or waveform distortion of the voltage of the AC power source are prevented by calculating the timing of turning on and off the switching element using a reference point determined on the basis of measured data of the phase difference between the zero-crossing signal and the oscillating signal. Unlike the system using a PLL circuit, the response speed will not be any problem. The signal processing is easier than in the case of removing noise or the like from the voltage signal of the AC power source. The present invention is particularly effective in the case of using a power supply susceptible to noise contamination or waveform distortion, such as a natural-energy power generation (e.g. wind power generation or solar power generation) or in-house power generation, both of which are expected to be more widely used in the future.

BRIEF DESCRIPTION OF THE DRAWINGS

FIG. 1 is a block diagram showing a lighting circuit including a dimmer according to one embodiment of the present invention.

FIGS. 3A-3H and 3A' are waveform charts for illustrating an operation of the dimmer of the present embodiment.

FIG. 4 is a flowchart showing the operation of the dimmer of the present embodiment.

BEST MODE FOR CARRYING OUT THE INVENTION

Figure 2A:
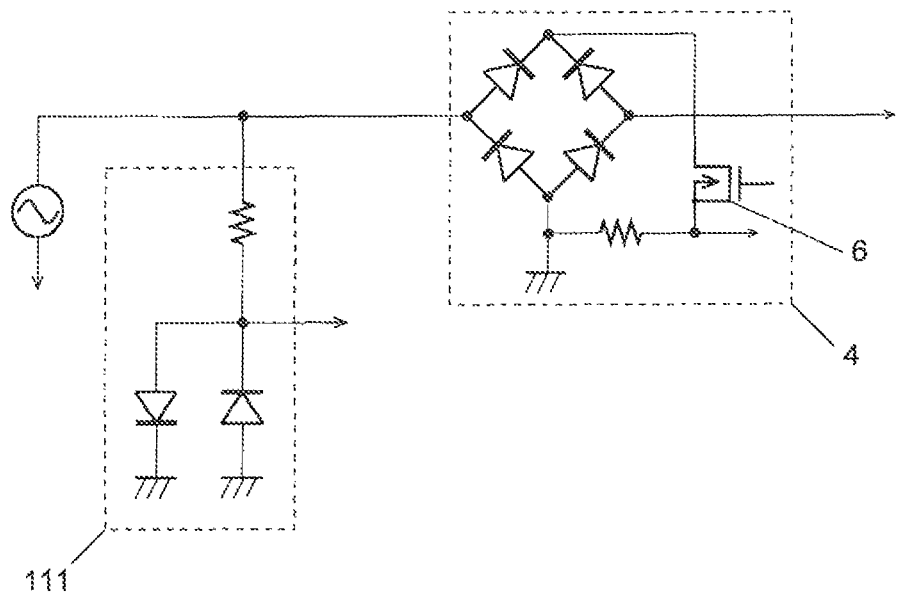
FIGS. 2A-2C are circuit diagrams of the zero-crossing detector section 111 and the switching circuit 4.

An embodiment of the dimmer according to the present invention will be hereinafter described by means of FIGS. 1-16.

EMBODIMENT (1) Configuration of Dimmer 1 of Present Embodiment

The dimmer 1 of the present embodiment is used in a lighting circuit shown in FIG. 1. It is serially connected to an AC power source 2 together with a lighting load 3, such as an LED. The dimmer consists of a switching circuit 4 and a time division control circuit 5.

Figure 2B:
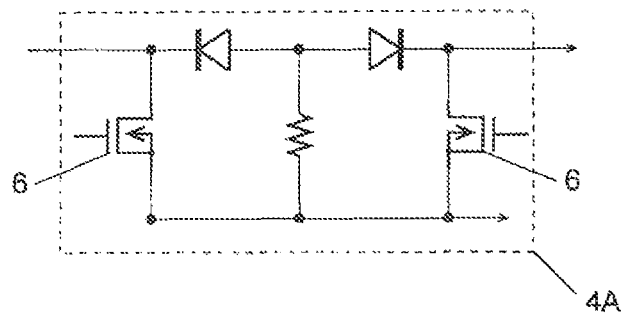
Figure 2C:
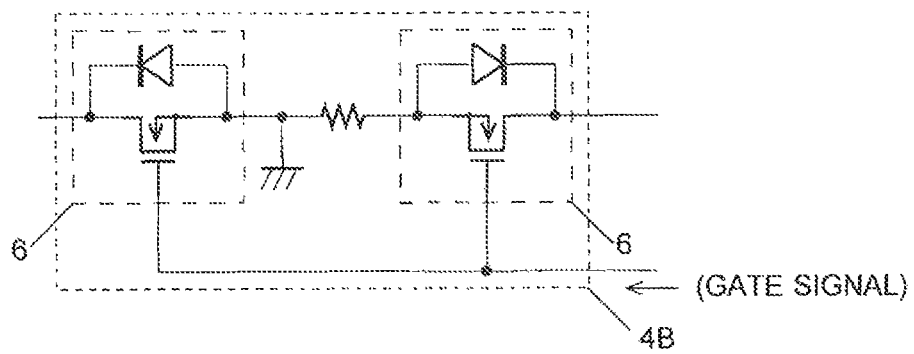

A generally used type of switching circuit 4 includes a rectifier circuit using a diode bridge, which consists of four diodes, with a switching element 6 provided therein (FIG. 2A). A field-effect transistor (FET) can be used as the switching element 6. Alternatively, as shown in FIG. 2B, a switching circuit 4A having two switching elements (FETs) and two diodes may also be used. This switching circuit 4A is advantageous for suppressing the loss of power because it has only one diode through which an electric current passes whereas the switching circuit 4 has two such diodes. In place of the diodes used in the switching circuit 4A, the built-in diodes (body diodes) of the FETs serving as the switching elements may be used (as in the switching circuit 4B shown in FIG. 2C). This design requires no external diode and makes the switching circuit simpler. This example is also advantageous for simplifying the control circuit since the two FETs can be controlled by one gate signal. As still another example, a triac (bidirectional thyristor) may be used. In this case, the switching circuit 4 can be created by using only one triac.

The time division control circuit 5 has a zero-crossing detector section 11, a frequency measurement section 12, an oscillator 13, a reference point determiner section 14, an on/off timing calculator section 15, a CPU 16, a time division control signal generator section 17, and a dimming level setter section 18.

The zero-crossing detector section 11 receives a signal of the voltage of the AC power source (which is hereinafter called the "source voltage"), generates a zero-crossing signal based on the received signal, and outputs the generated signal. The zero-crossing detector section 11 in the present embodiment detects the zero-crossing point of the signal of the source voltage by the zero-crossing detector circuit 111 shown in FIG. 2A. In the zero-crossing detector circuit 111, two diodes are parallel-connected, via a resistor, to a point between the AC power source 2 and the switching circuit 4 so that their polarities are oppositely directed to each other. Diodes have the characteristic that, after the voltage between the anode and the cathode has exceeded a predetermined level (activating voltage), the current passing therethrough can be increased with only a negligible increase in the voltage. Therefore, when the effective value of the source voltage is sufficiently higher than the activating voltage, the periodical change of the source voltage applied across the zero-crossing detector circuit 111 causes no change in the absolute value of the voltage applied between the ends of the diode; it merely changes the polarity of this voltage at each zero-crossing point. Based on this voltage applied the ends of the diode, a zero-crossing signal with binary values ($\pm V_c$) can be obtained.

The frequency measurement section 12 measures the frequency of the zero-crossing signal. The oscillator 13 generates an oscillating signal having a frequency equal to the frequency of the zero-crossing signal measured by the frequency measurement section 12 or to an integral multiple of the measured frequency.

The reference point determiner section 14 receives the zero-crossing signal and the oscillating signal, calculates the phase difference between them, and determines the timing of turning on or off the switching element 6 in such a manner as will be described later, based on the phase-difference data, or more specifically, based on the temporal change in the phase difference. The on/off timing calculator section 16 calculates the timing of turning on or off the switching element 6, based on the reference point determined by the reference point determiner section 14. The time division control signal generator section 17 sends the switching element 6 an on/off signal for turning on or off the switching element 6, based on the timing calculated by the on/off timing calculator section 15. The combination of the on/off timing calculator section 16 and the time division control signal generator section 17 corresponds to the time division signal generator.

The CPU 16 controls the previously described components, i.e. the frequency measurement section 12, the oscillator 13, the reference point determiner section 14, the on/off timing calculator section 15 and the time division control signal generator section 17. The reference point determiner section 14, the on/off timing calculator section 15 and the time division control signal generator section 17 are actually realized by the CPU 16. The CPU 16 also has the functions of determining the oscillation frequency of the oscillating signal based on the frequency measured by the frequency measurement section 12 and instructing the oscillator 13 of that frequency. Thus, the combination of the frequency measurement section 12 and the CPU 16 functions as the aforementioned frequency setter.

The dimming level setter section 18 allows users to set the brightness of the lighting apparatus at a desired level. The dimming level setter section 18 may be composed of hardware parts, such as a dial, or realized by a computer (software). In the present embodiment, a user should initially operate a dial to set a value, based on which a software program sets the actual dimming level. The dimming level set by the dimming level setter section 18 is sent to the on/off timing calculator section 15. If the dimming level has been set to increase the brightness, the on/off timing calculator section 15 calculates an on/off timing so that the ON period of the switching element 6 will be longer.

(2) Operation of Dimmer 1 of Present Embodiment

An operation of the dimmer 1 of the present embodiment is hereinafter described by means of the explanatory diagrams of FIGS. 3A-3H and 3A' as well as the flowchart of FIG. 4. To remove the influence of noise and other factors superimposed on the source voltage, the dimmer 1 repeatedly performs the following operations of Steps S1 through S6: The zero-crossing detector section 11 generates a zero-crossing signal 25 which indicates that the point in time where the absolute value of the source voltage has been found to be equal to or less than a predetermined threshold is a zero-crossing point 23 (Step S1 and FIG. 3B). In the present embodiment, since the previously described zero-crossing detector circuit 111 is used, the zero-crossing signal 25 is in the form of rectangular waves having a value of $+V_c$ when the source voltage is positive and $-V_c$ when negative. The source voltage may have noises 21 superimposed thereon (FIG. 3A), or its AC waveform may be distorted (FIG. 3A'). The noise contamination or AC waveform distortion is particularly likely to occur in an electric power created by a natural-energy power generation or in-house generation since the output power of these systems is low and unstable. If such a noise-contaminated signal of the source voltage is fed to the zero-crossing detector section 11, and if the noise 21 is located near the point in time that should inherently be a zero-crossing point (if no noise is present), then the source voltage with the noise 21 superimposed thereon changes from positive to negative, or vice versa, at a point in time 23 that is not the correct zero-crossing point, causing the zero-crossing detector section 11 to mistake this point for the zero-crossing point 23 and generate the zero-crossing signal 25 (FIG. 3B). Similarly, when the waveform of the source voltage is distorted, the zero-crossing signal 25 is generated at a point in time (denoted by numeral 21A) shifted from the point in time (denoted by numeral 22A) at which the zero-crossing signal should be generated when there is no waveform distortion. Although the following descriptions will be focused on the case of noise contamination, the same processing is applicable to the case of waveform distortion.

Meanwhile, the frequency measurement section 12 measures the zero-crossing signal 25 over multiple cycles. Therefore, it can determine the correct frequency of the source voltage by statistical calculation, such as averaging. Based on the determined correct frequency of the source voltage, the oscillator 13 generates an oscillating signal 26 (FIG. 3C). In the present embodiment, the oscillating signal 26 is in the form of rectangular waves taking the values of $\pm V_0$, with a frequency equal to two times that of the source voltage. It should be noted that the frequency of the oscillating signal 26 may be equal to the frequency of the source voltage or three or more times as high as the latter frequency. The oscillating signal 26 does not need to be in phase with that of the source voltage or zero-crossing signal 25; the oscillating signal is generated independent of them.

Every time the polarity of the zero-crossing signal 25 changes from positive to negative, or vice versa, the reference point determiner section 14 calculates the point in time 24 where the polarity of the oscillating signal 26 changes (Step S2). From the difference between the two points in time of the polarity change, the reference point determiner section 14 determines the measured value δTn of the phase difference between the zero-crossing signal 25 and the oscillating signal 26 (Step S3 and FIG. 3D). This measured value δTn of the phase difference varies in magnitude for each cycle due to the influence of the noise 21. Using a predetermined number of measured values of the phase difference that have been obtained until that point in time, the reference point determiner section 14 performs a statistical processing, which will be described later in the section "(3) Statistical Processing in Reference Point Determiner Section 14", to obtain the true phase difference δT (Step S4). Then, it determines, as the reference point, a point in time that is earlier by the true phase difference δT than the point in time 24 where the polarity of the oscillating signal 26 changes (Step S5, FIGS. 3E and 3F).

Subsequently, based on the reference point 22 determined by the reference point determiner 14, the on/off timing calculator section 15 determines the timing of turning on or off the switching element 6 as follows (Step S6). In the present embodiment, in each half cycle (i.e. for each period where the voltage is either positive or negative) of the source voltage as one unit, the period of time from the reference point 22 to a predetermined point in time is the OFF period, and the period of time from the predetermined point of time to the next reference point 22 is the ON period (Step 3G). The aforementioned predetermined point in time is determined on the basis of the effective voltage to be supplied to the lighting load 3, and this voltage is determined by the set value of the dimming level setter section 18. Based on the thus determined on/off timing, the time division control signal generator section 17 sends a time division signal to the switching element 6. Subsequently, the operations of Steps S1 through S6 are repeated. Thus, the effective voltage supplied to the lighting load 3 is controlled (FIG. 3H), whereby the dimming of the lighting load 3 is realized.

In the dimmer 1 of the present embodiment, it is unnecessary to synchronize the phase of the oscillating signal with that of the source voltage or the zero-crossing signal. Therefore, the response speed can be higher than in the case of using a PLL circuit. Since the number of sampled data to be handled is smaller than in the case of the conventional system which performs a fast Fourier transform on the signal of the AC voltage, it is unnecessary to use a high-performance CPU. This is advantageous for the cost reduction.

(3) Statistical Processing in Reference Point Determiner Section 14

Figure 5:
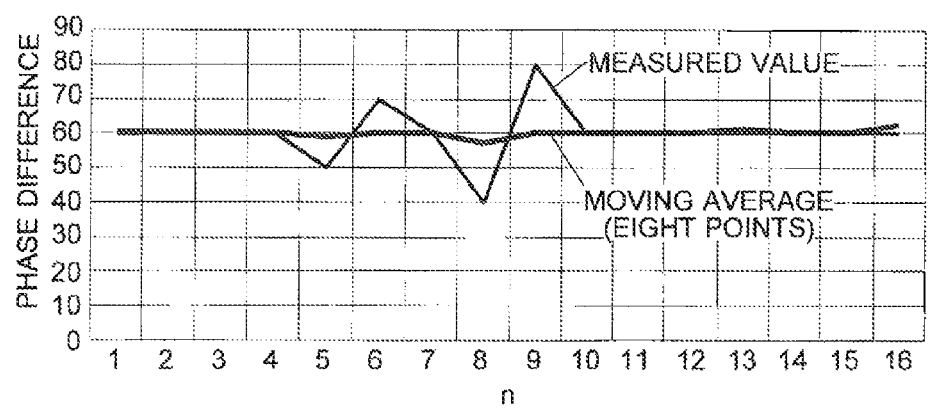
FIG. 5 is a graph showing one example of the statistical processing by the moving-average method.
Figure 6:
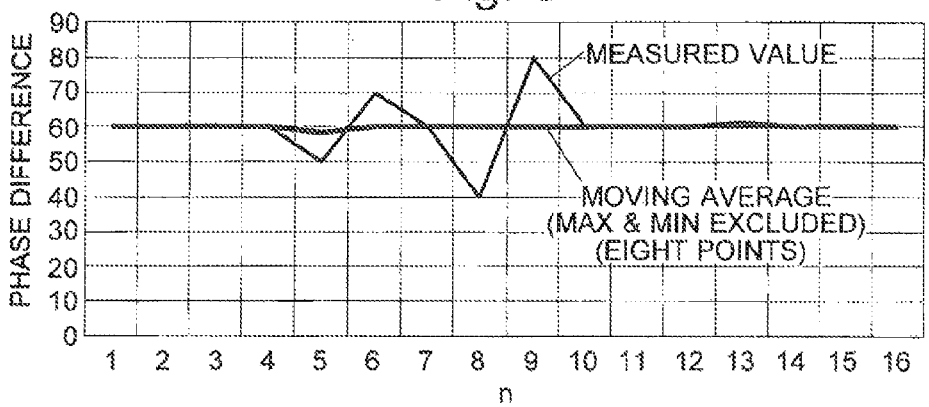
FIG. 6 is a graph showing a modified version of the statistical processing by the moving-average method.
Figure 7:
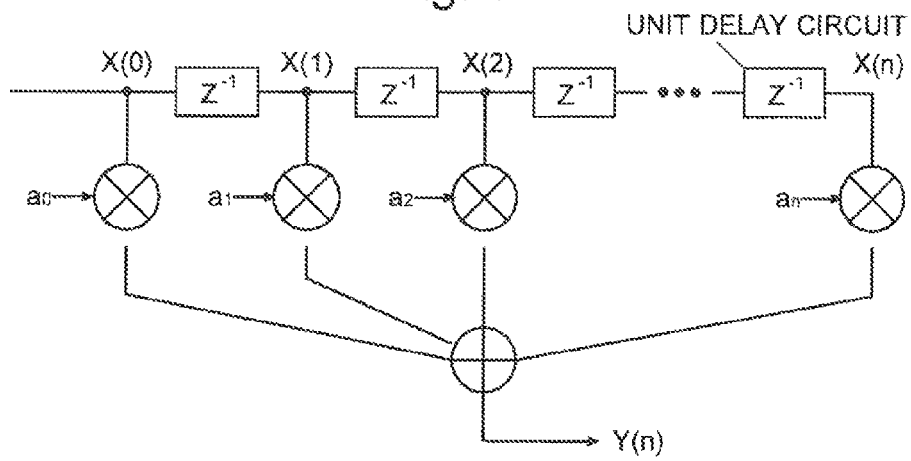
FIG. 7 is a block diagram of an FIR filter.
Figure 8:
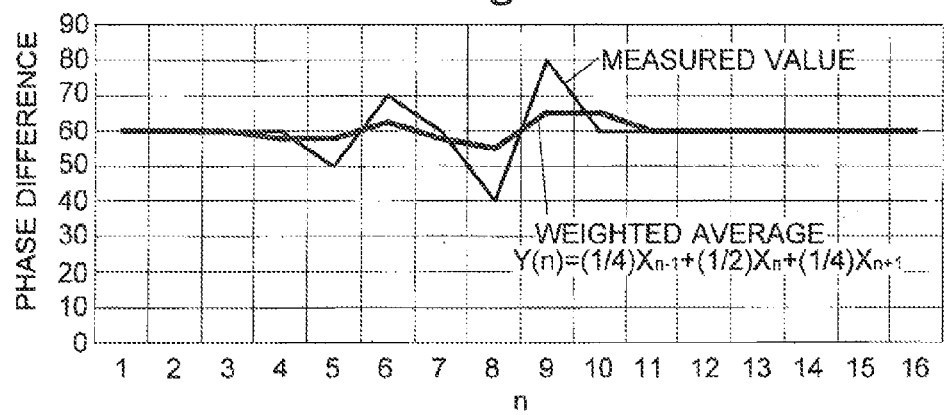
FIG. 8 is a graph showing one example of the statistical processing by an FIR filter.

One example of the statistical processing performed in the reference point determiner section 14 is hereinafter described by means of FIGS. 5-8. The following description deals with the case where the measured value δn (n is an integer) of the phase difference shown in FIG. 3D has changed with time (with an increase of n) as shown in FIG. 5. It should be noted that the measured values of the phase difference shown in FIGS. 6 and 8 are the same as those shown in FIG. 5.

(3-1) Statistical Processing by Moving-Average Method

The first example uses a moving-average method. According to this method, every time a measured value δn is obtained, a set of measured values consisting of a predetermined number of latest values including δn are averaged. FIG. 5 shows an example of averaging eight measured values. The measured values are distributed over a range of ±20°. By contrast, the values obtained by the moving-average method are confined within a range of ±2.5°. This error range of δn is sufficiently smaller than that of the measured values.

(3-2) Modified Version of Moving-Average Method

The second example is also a moving-average method. According to this method, every time a measured value δn is obtained, an average is calculated for a set of measured values that remains after the largest and smallest values are excluded from a predetermined number (equal to or greater than four) of latest values including δn. The largest and smallest values are likely to originate from noise. Excluding these values from the average calculation improves the noise removal effect. FIG. 6 shows an example of averaging eight measured values which remained after the largest and smallest values were excluded from ten measured values. The graph demonstrates that the variation of the average value has even more reduced than in the case of FIG. 5.

(3-3) Finite Impulse Response (FIR) Filter

The third example is a system using an FIR filter, which is a representative filter. FIG. 7 is a block diagram of the FIR filter used in the present embodiment. At each point in time, this FIR filter receives a measured value as $X(n)=X(0)$. Every time a new measured value is obtained, the serial number n of each of the previously obtained measured values is incremented by one, such as $X(1)$, $X(2)$, and so on. Then, the measured values $X(n)=X(0), X(1), X(2), \ldots$ are respectively multiplied by coefficients $a_n=a_0, a_1, a_2, \ldots$, (where the sum of $a_0, a_1, a_2, \ldots$ is one), and the sum of the weighted values, i.e. $Y(n)=a_0X(0)+_1X(1)+a_2X(2)+ \ldots +aX(n)$, is outputted as the average value. The value of the coefficient $a_n$ may be changed for each value of n, for example, in such a manner that $a_n$ becomes larger as the elapsed time from the measurement of $X(n)$ is shorter.

Figure 9A:
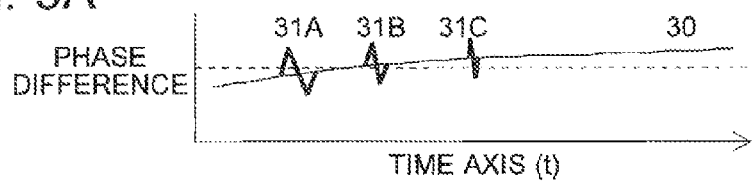
FIGS. 9A-9D are conceptual diagrams showing an operation of an FFT filter.
Figure 9B:
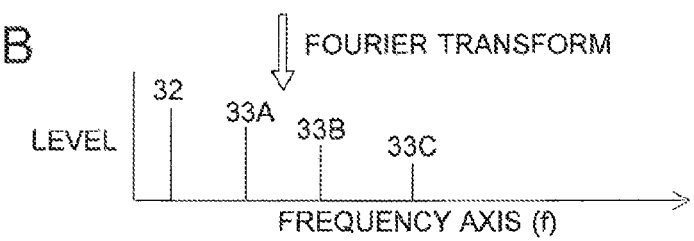
Figure 9C:
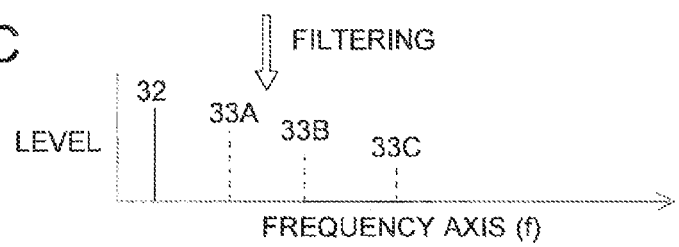
Figure 9D:
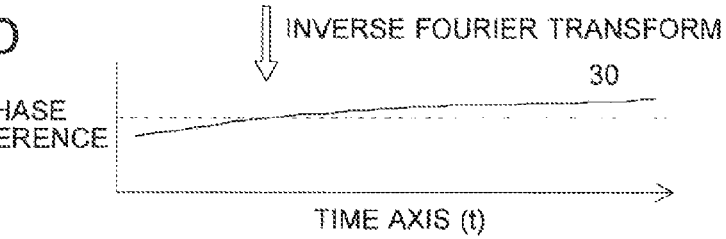

As one specific example, FIG. 8 shows the result of a calculation of an output value of the phase difference in which three latest measured values δn of the phase difference were averaged, with the second value (n=1) weighted by coefficient $a_1=1/2$, while the first and third coefficients being $a_0=1/4$ and $a_2=1/4$; that is, $Y=(1/4)X(0)+(1/2)X(1)+(1/4)X(2)$. Since the number of sampled phase-difference values is three, the variation of the output value in the present example is somewhat larger than those of the first and second examples. However, the variation in the output value of the FIR system can also be reduced by increasing the number of sampled data (3-4) FFT Filter The fourth example is a system using an FFT filter. FIGS. 9A-9D are conceptual diagrams showing an operation of an FFT filter. A change in the measured value δn of the phase difference between the zero-crossing signal and the oscillating signal determined in the reference point determiner section 14 (FIG. 3D) can be plotted on a graph with the horizontal axis indicating time, as shown in FIG. 9A. In this graph, if the zero-crossing signal is contaminated by noise, error components 31A, 31B, 31C, . . . , causing a sudden change in the measured value of the phase difference, will be superimposed on the original signal 30. In the fourth example, a Fourier transform is performed on the data of this graph. FIG. 9B shows the result by a graph with the horizontal axis indicating the frequency, in which one peak 32 corresponding to the true frequency of the zero-crossing signal is observed along with the peaks 33A, 33B, 33C, . . . originating from the errors. Then, the peaks 33A, 33B, 33C, . . . originating from the errors are removed from the data of the graph (filtering process; FIG. 9C). After these peaks are removed, an inverse Fourier transform is performed on the remaining data. As a result, a graph of the phase difference δT free from noise, with the horizontal axis indicating time, is obtained (FIG. 9D).

Figure 10:
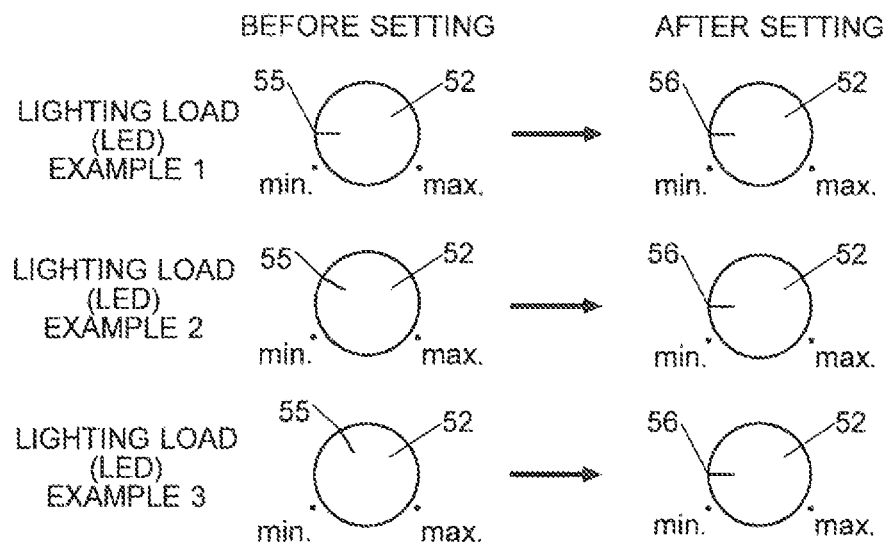
FIG. 10 is a diagram showing the light-activating positions of a dimming dial provided in the dimmer of the present embodiment before and after the setting of the relationship between the rotational angle of the dimming dial and the actual dimming level.
Figure 11:
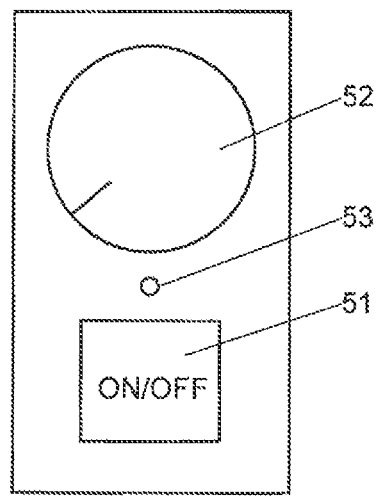
FIG. 11 is a plan view showing an ON/OFF switch, a dimming dial and an indicator provided in the dimmer of the present embodiment.
Figure 12:
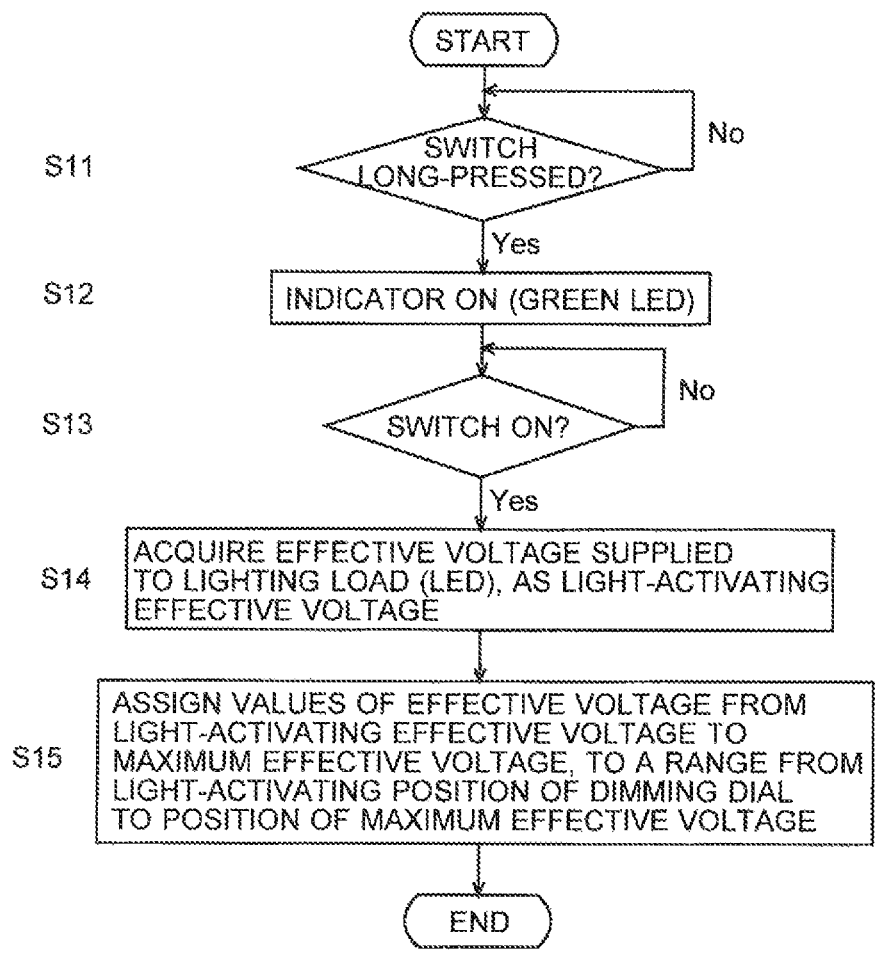
FIG. 12 is a flowchart showing an operation of relating the rotational angle of the dimming dial and the actual dimming level.

(4) Setting Relationship Rotational Angle of Dimming Dial and Actual Dimming Level A method for setting the relationship between the rotational angle of a dimming dial, which is included in the dimming level setter section 18 of the present embodiment for user operation, and the actual dimming level is hereinafter described by means of FIG. 10-12.

The reason why such a setting is necessary is as follows: In LEDs, when an effective voltage supplied to the load is increased from zero, the device remains inactive until the effective voltage reaches a certain threshold (which is hereinafter referred to as the light-activating effective voltage). If the effective voltages from the minimum (effective voltage=0) to the maximum levels are simply assigned over the range of movement (operating range) of the dimming dial 52, the LED will not become activate until the dimming dial being rotated toward higher effective voltages reaches a rotational position 55 corresponding to the aforementioned threshold, making the operation useless (FIG. 10, left). Furthermore, since each LED element has a different light-activating effective voltage (FIG. 10, left), the operational feeling changes depending on which LED element is connected. Given these problems, as will be described later, a predetermined position within the range of movement of the dimming dial is related to the light-activating effective voltage so as to prevent the range where the LED is inactive from occupying too wide a section within the range of movement of the dial, as well as to prevent the operational feeling from being varied due to the use of a different LED element.

A specific method for setting the dimming level is as follows: As shown in FIG. 11, the dimmer 1 of the present invention has an ON/OFF switch 51 and a dimming dial 52 to be operated by users. The ON/OFF switch 51 is a push-button switch which is normally used for turning on and off the LED (lighting load 3). Pushing this switch cyclically changes the state of lighting; one push turns on the light, the next push turns it off, and so on. The dimming dial 52 is used for regulating the diming level. Rotating this dial clockwise makes the LED emit stronger light. To perform the operation of setting the relationship between the dimming dial 52 and the dimming level (e.g. when the LED has been replaced), the ON/OFF switch 51 is set to the ON position and the dimming dial 52 is set to the maximum value (i.e. the dial is fully turned clockwise). Subsequently, the ON/OFF switch 51 is continuously pressed for several seconds (five seconds in the present embodiment). This "long pressing" triggers the operation of setting the dimming level (Step S11 in FIG. 12). Then, the indicator 53 below the dimming dial 52 turns on (Step S12). The indicator 53 is a green LED with an output lower than that of the LED used as the lighting load 3. Its light informs the user that the device is in the mode for setting the dimming level. In this mode, the user turns the dimming dial 52 counterclockwise, and when the LED (lighting load 3) has turned off, i.e. when the effective voltage supplied to the LED has been set to the lowest level for activating the LED, the user pushes the ON/OFF switch 51 (Step S13). In response to this operation, the dimming level setter section 18 acquires, as the light-activating effective voltage, the effective voltage being supplied to the LED of the lighting load 3 at that moment (Step S14). Then, the dimming level setter section 18 assigns the values of the effective voltage from the light-activating effective voltage to the maximal effective voltage, to a rotational range from the light-activating position 56, which is the predetermined position within the range of movement of the dimming dial 52, to the position where the dial is fully turned clockwise, i.e. the position corresponding to the maximal effective voltage (Step S15). Thus, the setting of the dimming level is completed.

By setting the dimming level in the previously described manner, it is possible to make the LED (lighting load 3) begin to emit light at the same light-activating position 56 of the dimming dial 52 even if the light-activating position before the setting is different.

The aforementioned setting can be cancelled by setting the dimming dial 52 to the minimum value (by fully turning it counterclockwise) and holding down ("long-pressing") the ON/OFF switch 51.

(5) DC Power Source for Operating Time Division Control Circuit 5

Figure 13A:
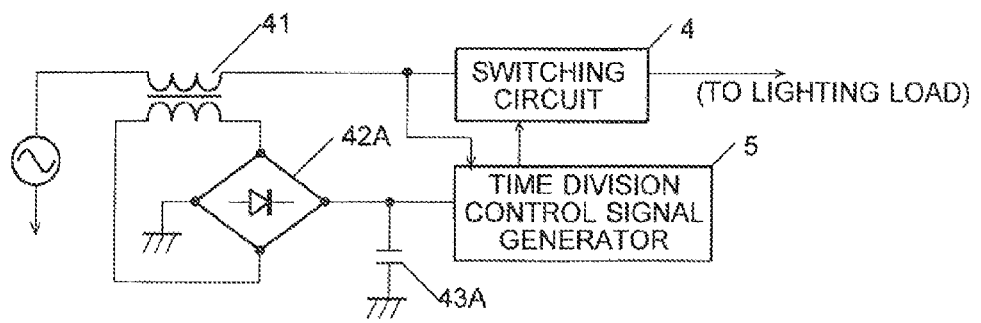
FIGS. 13A and 13B are circuit diagrams showing examples of the DC power source used in the dimmer according to the present invention.
Figure 13B:
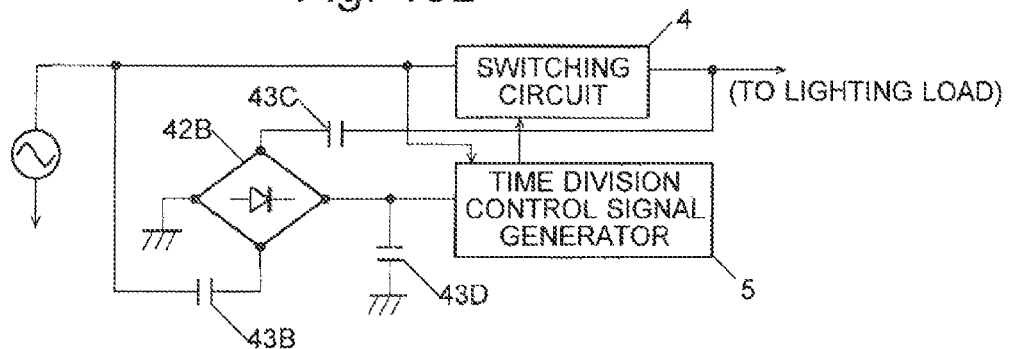

By means of FIGS. 13A and 13B, examples of the DC power source for driving one or more of the following components included in the time division control circuit 5 are hereinafter described: the zero-crossing detector section 11, the frequency measurement section 12, the oscillator 13, the reference point determiner section 14, the on/off timing calculator section 15, the CPU 16, the time division control signal generator section 17 and the dimming level setter section 18.

The DC power source 40A of the first example (FIG. 13A) has a transformer 41 whose primary winding is serially connected to the lighting load 3 with respect to the AC power source 2. The two ends of the secondary winding of this transformer 41 are respectively connected to the two input terminals of a bridge rectifier circuit 42A. One of the two output terminals of the bridge rectifier circuit 42A is connected to a ground, while the other terminal is connected to the load for this DC power source 40A (i.e. to the time division control circuit 5). A branch extending from a point between the bridge rectifier circuit 42A and the load is connected to one end of a capacitor 43A. The other end of the capacitor 43A is connected to a ground.

In this DC power source 40A, while the switching element 6 is in the ON state, an alternating current supplied to the lighting load 3 flows through the primary winding of the transformer 41, which induces an alternating current through the secondary winding. The alternating current passing through the secondary winding is converted by the bridge rectifier circuit 42A into a one-directional current whose intensity changes with time. This current is smoothed by the capacitor 43A. Thus, a substantially direct current is supplied to the time division control circuit 5. On the other hand, while the switching element 6 is in the OFF state, no electric current passes through the primary winding of the transformer 41, so that a direct current is supplied from the capacitor 43A. It should be noted that the intensity of the direct current supplied from the capacitor 43A decreases with the passage of time within one cycle of the OFF period. Accordingly, it is preferable to use another DC power source 40B, which will be subsequently described, together with the DC power source 40A. The effects obtained by using the two power sources will be described later.

The DC power source 40B of the second example (FIG. 13B) has a bridge rectifier circuit 42B. The two input terminals of the bridge rectifier circuit 42B are connected in parallel to the switching circuit 4. In the path of this parallel connection, a pair of first capacitors 43B and 43C are provided across the bridge rectifier circuit 42B. One of the two output terminals of the bridge rectifier circuit 42B is connected to a ground, while the other is connected to the load (time division control circuit 5). A branch extending from a point between the bridge rectifier circuit 42B and the load is connected to one end of a second capacitor 43D. The other end of this capacitor 43D is connected to a ground.

In the DC power source 40B, while the switching element 6 is in the OFF state, an AC voltage is applied across the switching circuit 4. The same AC voltage is also applied between the two ends of the current path which is connected in parallel to the switching circuit 4 and has the first capacitors 43B, 43C and the bridge rectifier circuit 42B. As a result, an alternating current is generated through this path. This alternating current is converted by the bridge rectifier circuit 42B into a one-directional current whose intensity changes with time, and this current is subsequently smoothed by the second capacitor 43D. Thus, a substantially direct current is supplied to the time division control circuit 5. On the other hand, while the switching element 6 is in the ON state, a direct current is supplied from the second capacitor 43D.

The alternating current passing through the aforementioned path during the OFF period of the switching element 6 also flows (leaks) into the lighting load 3. However, since the intensity of the current necessary for operating the time division control circuit 5 is normally one or more orders of magnitudes lower than the intensity of the current necessary for operating the lighting load 3, it is possible to reduce the intensity of the alternating current by using the first capacitors 43B and 43C having adequately low capacities, whereby a direct current can be generated without influencing the operation of the lighting load 3.

As described thus far, the DC power source 40A generates a direct current from an alternating current during the ON period of the switching element 6, while the other DC power source 40B generates a direct current from an alternating current during the OFF period of the switching element 6. Therefore, it is possible to create a stable supply of direct current by using both DC power sources 40A and 40B.

Figure 14:
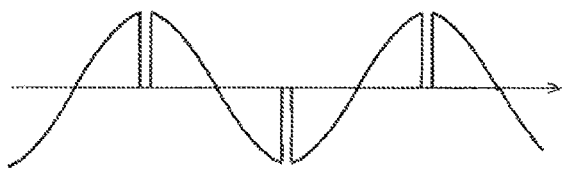
FIG. 14 is a graph showing an example of a voltage with a short OFF period, which is suitable when the DC power source of FIG. 13B is used.

When the effective voltage supplied to the lighting load 3 is to be maximized, the switching element 6 can be continuously held in the ON state. However, this prevents the DC power source 40B from continuously supplying the direct current. To avoid this problem, the effective voltage (corresponding to FIG. 3H) supplied to the lighting load 3 may preferably be have a short OFF period, as shown in FIG. 14, even in the case of maximizing the effective voltage supplied to the lighting load 3.

(6) Improvement of Power Factor by Adjusting Timing of Turning On/Off the Switching Element 6

Figure 15A:
FIGS. 15A-15E are graphs showing other examples of the timing of turning on/off the switching element 6.
Figure 15B:
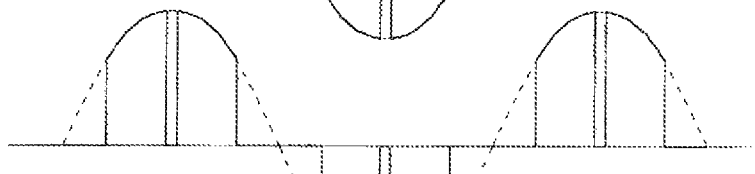
Figure 15C:
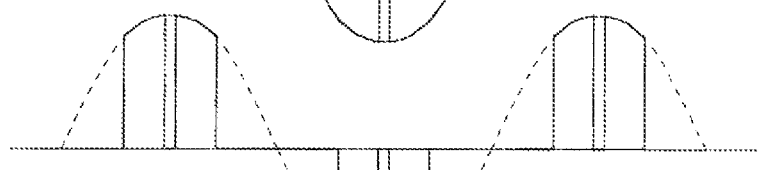
Figure 15D:
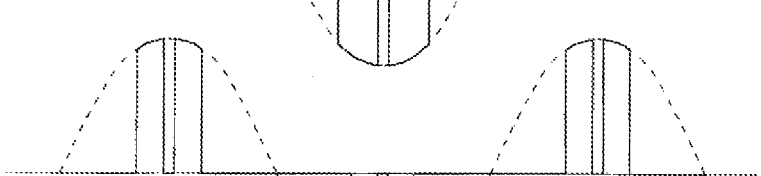
Figure 15E:
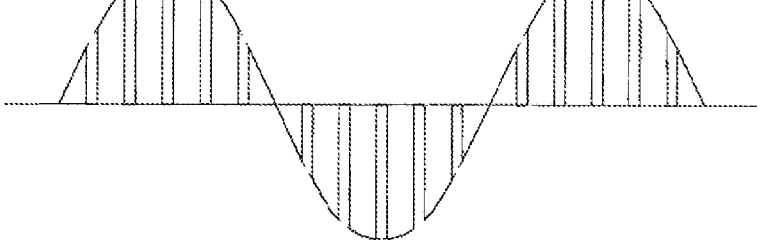

Other than the example shown in FIG. 3H in which the switching element 6 is turned off (or on) at the zero-crossing points, the timing of switching on/off may be determined so that the ON (or OFF) periods appear in such a manner that the voltage waveform becomes symmetrical with respect to the point in time that is out of phase with the zero-crossing point by $\pi/2$ (i.e. the peak position at which the absolute value of the voltage is maximized), as shown in FIGS. 15A-15E. More specifically, the point in time $(\pi/2)-\Delta$ with respect to the zero-crossing point is chosen as the timing of turning on, and the point in time $(\pi/2)+\Delta$ is chosen as the timing of turning off. Controlling the timing of turning on/off in this manner reduces the magnitude of the phase shift between the AC voltage and the alternating current, and thereby prevents a decrease in the power factor during the dimming operation. In the examples shown in FIGS. 15A-15E, the ON period becomes shorter (i.e. the effective voltage supplied to the lighting load becomes lower) as the waveform changes from FIG. 15A through 15B and 15C to 15D. In FIG. 15E, the on/off switching is performed multiple times within one cycle of the voltage. It should be noted that the short OFF period which has been provided in all the examples of FIGS. 15A-15E due to the same reason as explained in the example of FIG. 14 is unnecessary as far as the improvement of the power factor is concerned.

(7) Other Variations

The present invention is not limited to the previously described embodiment. For example, it can be modified as follows.

(7-1) Setting of Oscillation Frequency of Oscillator 13

In the previous embodiment, the oscillation frequency of the oscillator 13 was determined on the basis of the frequency of the zero-crossing signal measured by the frequency setter section 12. Alternatively, it may be determined by measuring the frequency of the AC power source 2. It is also possible to allow users to manually set the frequency of the oscillator. If the AC power source to be used for the dimmer is specified, it is possible to use an oscillator whose frequency is fixed at a level equal to the fixed frequency of the power source or to an integer multiple of this fixed frequency.

(7-2) Zero-Crossing Detector Section

Figure 16:
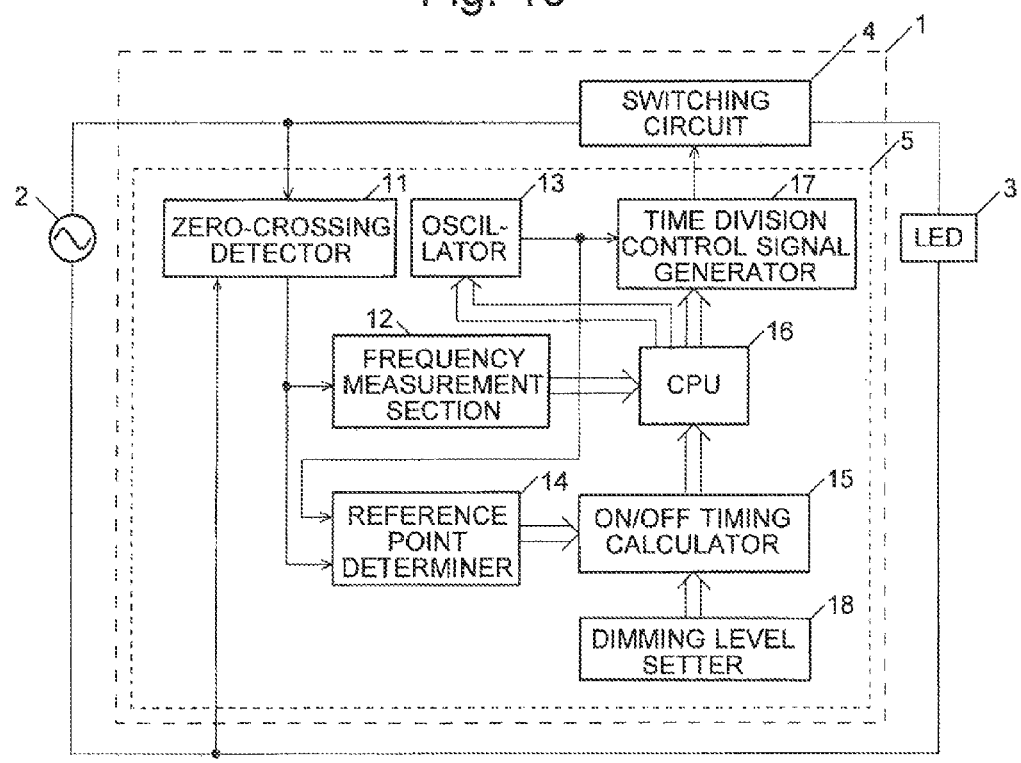
FIG. 16 is a block diagram showing a lighting circuit including a dimmer according to a variation of the present invention.

In the previous embodiment, the zero-crossing detector section 11 detects the zero-crossing point on the basis of the voltage of the alternating current flowing between the AC power source 2 and the switching circuit 4. It is also possible, as shown in FIG. 16, to additionally measure the voltage of an alternating current flowing between the AC power source 2 and the lighting load 3 on the opposite side from the switching circuit 4 and detect the zero-crossing point from the difference between the two voltages. By this method, the zero-crossing point can be detected in a stable manner even if the lighting circuit cannot be connected to a ground.

(7-3) Zero-Crossing Signal

The zero-crossing signal in the previous embodiment was rectangular waves having a value of $+V_c$ when the source voltage was positive and $-V_c$ when negative. Alternatively, a signal having a pulse-like form at the zero-crossing point may be used.

EXPLANATION OF NUMERALS

1 . . . Dimmer
2 . . . AC (Alternating-Current) Power Source
3 . . . Lighting Load
4, 4A, 4B . . . Switching Circuit
5 . . . Time Division Control Circuit
6 . . . Switching Element
11 . . . Zero-Crossing Detector Section
111 . . . Zero-Crossing Detector Circuit
12 . . . Frequency Measurement Section
13 . . . Oscillator
14 . . . Reference Point Determiner Section
15 . . . On/Off Timing Calculator Section
16 . . . CPU (Central Processing Unit)
17 . . . Time Division Control Signal Generator Section
18 . . . Dimming Level Setter Section
21 . . . Noise
21A . . . Point in Time of Generation of Zero-Crossing Point, Displaced Due to Waveform Distortion
22 . . . Reference Point
22A . . . Correct Point in Time at Which Zero-Crossing Point Should Be Generated
23 . . . Zero-Crossing Point
24 . . . Point in Time at Which Polarity of Oscillating Signal Changes
25 . . . Zero-Crossing Signal
26 . . . Oscillating Signal
30 . . . Signal
31A, 31B, 31C . . . Error Component
32 . . . Peak
33A, 33B, 33C . . . Noise Peak
40A, 40B . . . DC (Direct-Current) Power Source
41 . . . Transformer
42A, 42B . . . Bridge Rectifier Circuit
42B . . . Bridge Rectifier Circuit
43A . . . Capacitor
43B, 43C . . . First Capacitor
43D . . . Second Capacitor
51 . . . ON/OFF Switch
52 . . . Dimming Dial
53 . . . Indicator
55 . . . Light-Activating Position before Setting of Dimming Level in Diming Dial
55 . . . Light-Activating Position after Setting of Dimming Level in Diming Dial

The invention claimed is:

1. A dimmer including: a switching circuit having a switching element and being serially connected to an alternating-current (AC) power source and a lighting load; and a time division control circuit for controlling an effective voltage supplied to the lighting load by regulating the period of time to turn on the switching element, and the dimmer further comprising:

a) a zero-crossing detector for detecting a zero-crossing point at which a voltage of the AC power source becomes zero and for generating a zero-crossing signal whose value changes at the zero-crossing point;

b) an oscillator for generating an oscillating signal having a frequency equal to a frequency of the AC power source or an integral multiple of the frequency of the AC power source;

c) a reference point determiner for measuring a phase difference between the zero-crossing signal and the oscillating signal every time the zero-crossing signal is generated, and for determining a reference point for setting a timing of turning on or off the switching element based on a data of a measured value of the phase difference; and d) a time division control signal generator for sending to the switching element an on/off signal for turning on or off the switching element, at the timing determined on a basis of the reference point and the effective voltage to be supplied to the lighting load.

2. The dimmer according to claim 1, further comprising a frequency setter for measuring the frequency of the AC voltage or a frequency of the zero-crossing signal, and for setting the frequency of the oscillating signal generated by the oscillator based on a measured value of the frequency.

3. The dimmer according to claim 1, wherein the reference point is determined by computing a finite impulse response to the measured values of the phase difference.

4. The dimmer according to claim 1, wherein the reference point is determined by computing a Fourier transform of a temporal change of the phase difference, removing a frequency component originating from noise, and computing an inverse Fourier transform.

5. The dimmer according to claim 1, wherein the reference point determiner determines, as the timing of turning on, a point in time that is a predetermined length of time earlier than a point in time that is out of phase with the reference point by $\pi/2$, and determines, as the timing of turning off, a point in time that is the same length of time later than the point in time that is out of phase with the reference point by $\pi/2$.

6. The dimmer according to claim 1, wherein the zero-crossing signal detector acquires the zero-crossing signal based on a voltage applied between two diodes in a zero-crossing circuit, where the two diodes is parallel-connected to the AC power source and has polarities oppositely directed to each other.

7. The dimmer according to claim 1, comprising a plurality of the switching elements.

8. The dimmer according to claim 1, wherein the reference point is determined on a basis of a moving average of the measured values of the phase difference.

9. The dimmer according to claim 8, wherein the moving average is an average of measured values that remains after largest and smallest values are excluded from four or more measured values.

10. The dimmer according to claim 1, further comprising a dimming level operation part having an operating range between a lower limit and an upper limit, and a dimming level setter for setting a dimming level of the lighting load based on a position of the dimming level operation part within the operating range, for performing an operation for setting the effective voltage to be supplied to the lighting load, wherein
the dimming level setter is constructed so that a minimum effective voltage at which the lighting load begins to emit light is set as a light-activating effective voltage, the light-activating effective voltage is related to a predetermined light-activating position within the operating range of the dimming level operation part, and values of the effective voltage between the light-activating effective voltage and a highest level of the effective voltage to the lighting load within the aforementioned operating range are assigned between the light-activating position and a position corresponding to the highest level of the effective voltage.

11. The dimmer according to claim 10, wherein the light-activating position is located on a higher-voltage side with respect to the lower limit of the operating range.

12. The dimmer according to claim 1, comprising a direct-current power source for operating at least one of the zero-crossing detector, the oscillator, the reference point determiner and the time division control signal generator, the direct-current power source including:
a transformer having a primary winding serially connected to the lighting load with respect to the AC power source;
a bridge rectifier circuit having two input terminals connected to a secondary winding of the transformer and two output terminals one of which is connected to a ground; and
a capacitor having one terminal connected to a ground and another terminal connected to one of the two output terminals of the bridge rectifier circuit that is not connected to the ground.

13. The dimmer according to claim 12, wherein, when the effective voltage supplied to the lighting load is to be maximized, the time division control signal generator generates the on/off signal so that a period of time for turning off the switching element is provided.

14. The dimmer according to claim 1, comprising a direct-current power source for operating at least one of the zero-crossing detector, the oscillator, the reference point determiner and the time division control signal generator, the direct-current power source including:
a bridge rectifier circuit having two input terminal connected in parallel to the switching circuit;
a pair of first capacitors provided across the bridge rectifier circuit in a path of the parallel connection of the bridge rectifier circuit; and
a secondary capacitor having one terminal connected to a ground and another terminal connected to one of two output terminals of the bridge rectifier circuit that is not connected to a ground.

15. The dimmer according to claim 14, further comprising a second direct-current power source for operating at least one of the zero-crossing detector, the oscillator, the reference point determiner and the time division control signal generator, the second direct-current power source including:
a transformer having a primary winding serially connected to the lighting load with respect to the AC power source;
a second bridge rectifier circuit having two input terminals connected to a secondary winding of the transformer and two output terminals one of which is connected to a ground; and
a third capacitor having one terminal connected to a ground and another terminal connected to one of the two output terminals of the second bridge rectifier circuit that is not connected to the ground.

* * * * *

UNITED STATES PATENT AND TRADEMARK OFFICE
CERTIFICATE OF CORRECTION

| | | |
|---|---|---|
| PATENT NO. | : 8,618,743 B2 | Page 1 of 1 |
| APPLICATION NO. | : 13/699907 | |
| DATED | : December 31, 2013 | |
| INVENTOR(S) | : Takakazu Miyahara et al. | |

It is certified that error appears in the above-identified patent and that said Letters Patent is hereby corrected as shown below:

In the Claims:

At column 16, line number 30, please change "terminal" to --terminals--.

Signed and Sealed this
Eleventh Day of March, 2014

Michelle K. Lee
*Deputy Director of the United States Patent and Trademark Office*